United States Patent
Tu et al.

(10) Patent No.: US 9,419,359 B2
(45) Date of Patent: Aug. 16, 2016

(54) PLUG AND PRINTED CIRCUIT BOARD ASSEMBLY

(71) Applicant: Huawei Device Co., Ltd., Shenzhen (CN)

(72) Inventors: Jin Tu, Shenzhen (CN); Yu Chen, Shenzhen (CN); Haisen Bao, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/547,408

(22) Filed: Nov. 19, 2014

(65) Prior Publication Data

US 2015/0171529 A1 Jun. 18, 2015

Related U.S. Application Data

(63) Continuation of application No. PCT/CN2013/089391, filed on Dec. 13, 2013.

(51) Int. Cl.
*H01R 12/00* (2006.01)
*H01R 12/70* (2011.01)
(Continued)

(52) U.S. Cl.
CPC .......... *H01R 12/7082* (2013.01); *G07C 5/0808* (2013.01); *H01R 12/58* (2013.01); *H01R 12/724* (2013.01); *H01R 12/73* (2013.01);
(Continued)

(58) Field of Classification Search
CPC .......... H01R 23/7073; H01R 23/7068; H01R 23/6873; H01R 12/57; H01R 12/585
USPC .......................................... 439/78, 79, 82, 83
See application file for complete search history.

(56) References Cited

U.S. PATENT DOCUMENTS

| | | | |
|---|---|---|---|
| 6,494,724 B1 | 12/2002 | Bixler et al. | |
| 7,591,683 B2 * | 9/2009 | Zhang | H01R 12/716 439/638 |

(Continued)

FOREIGN PATENT DOCUMENTS

| | | |
|---|---|---|
| CN | 2405322 Y | 11/2000 |
| CN | 2577461 Y | 10/2003 |

(Continued)

OTHER PUBLICATIONS

Foreign Communication From a Counterpart Application, European Application No. 13883345.4, Extended European Search Report dated Oct. 5, 2015, 6 pages.

(Continued)

*Primary Examiner* — Hien Vu
(74) *Attorney, Agent, or Firm* — Conley Rose, P.C.; Grant Rodolph; Nicholas K. Beaulieu (57) ABSTRACT

A plug and a printed circuit board (PCB) assembly are provided that relate to the field of vehicle testing and reduce a volume of the PCB assembly. The plug includes a plug body, where a first row of slots and a second row of slots are disposed on the plug body; and the plug further includes first pins in one-to-one correspondence with the first row of slots and second pins in one-to-one correspondence with the second row of slots; the first pin is L-shaped, and the other end is configured to connect to a first PCB; and the second pin is stair-shaped, one end of the second pin is embedded in a slot, in a corresponding position, of the second row of slots, and the other end is configured to connect to the first PCB, is parallel to the end.

9 Claims, 10 Drawing Sheets

(51) Int. Cl.
  H01R 13/04 (2006.01)
  H01R 12/72 (2011.01)
  H01R 12/73 (2011.01)
  G07C 5/08 (2006.01)
  H01R 12/58 (2011.01)
  *H05K 3/36* (2006.01)
  *H05K 1/14* (2006.01)
  *H05K 1/18* (2006.01)

(52) U.S. Cl.
  CPC ............... *H01R 13/04* (2013.01); *H05K 1/144* (2013.01); *H05K 1/184* (2013.01); *H05K 3/368* (2013.01); *H05K 2201/042* (2013.01); *H05K 2201/10189* (2013.01)

(56) References Cited

U.S. PATENT DOCUMENTS

| | | | | |
|---|---|---|---|---|
| 7,682,163 B2 * | 3/2010 | Hou | ...................... | H01R 12/712 439/79 |
| 7,722,407 B2 * | 5/2010 | Momose | .............. | H05K 1/0216 439/108 |
| 7,748,999 B1 * | 7/2010 | Sun | ...................... | H01R 12/716 439/607.36 |
| 7,857,665 B2 * | 12/2010 | Xiong | .................. | H01R 12/712 439/660 |
| 2007/0087586 A1 * | 4/2007 | Karamooz | ........... | H01R 43/205 439/65 |
| 2007/0238330 A1 * | 10/2007 | Xiao | ...................... | H01R 12/58 439/101 |
| 2010/0041255 A1 | 2/2010 | Hanyu et al. | | |

FOREIGN PATENT DOCUMENTS

| | | | |
|---|---|---|---|
| CN | 1474481 | A | 2/2004 |
| CN | 201238124 | Y | 5/2009 |
| CN | 202454060 | U | 9/2012 |
| CN | 103067763 | A | 4/2013 |
| EP | 0810696 | A2 | 12/1997 |
| JP | 11260487 | A | 9/1999 |
| JP | 2006147372 | A | 6/2006 |
| JP | 2008117591 | A | 5/2008 |
| JP | 2010027256 | A | 2/2010 |
| JP | 2012068796 | A | 4/2012 |
| JP | 2012124332 | A | 6/2012 |

OTHER PUBLICATIONS

Partial English Translation and Abstract of Chinese Patent Application No. CN103067763A, Nov. 25, 2014, 4 pages.
Partial English Translation and Abstract of Chinese Patent Application No. CN2577461Y, Nov. 25, 2014, 15 pages.
Foreign Communication From a Counterpart Application, PCT Application No. PCT/CN2013/089391, International Search Report dated Sep. 1, 2014, 8 pages.
Foreign Communication From a Counterpart Application, PCT Application No. PCT/CN2013/089391, Written Opinion dated Sep. 1, 2014, 4 pages.
Partial English Translation and Abstract of Japanese Patent Application No. JPA2006147372, Apr. 6, 2016, 30 pages.
Partial English Translation and Abstract of Japanese Patent Application No. JPA2008117591, Apr. 6, 2016, 42 pages.
Partial English Translation and Abstract of Japanese Patent Application No. JPA2010027256, Apr. 6, 2016, 22 pages.
Partial English Translation and Abstract of Japanese Patent Application No. JPA2012068796, Apr. 6, 2016, 36 pages.
Partial English Translation and Abstract of Japanese Patent Application No. JPA2012124332, Apr. 6, 2016, 28 pages.
Foreign Communication From a Counterpart Application, Japanese Application No. 2015-551962, Japanese Office Action dated Jan. 26, 2016, 5 pages.
Foreign Communication From a Counterpart Application, Japanese Application No. 2015-551962, English Translation of Japanese Office Action dated Jan. 26, 2016, 7 pages.

* cited by examiner

PLUG AND PRINTED CIRCUIT BOARD ASSEMBLY

CROSS-REFERENCE TO RELATED APPLICATION

This application is a continuation of International Application PCT/CN2013/089391, filed on Dec. 13, 2013, which is hereby incorporated by reference in its entirety.

TECHNICAL FIELD

The present invention relates to the field of vehicle testing, and in particular, to a plug and a printed circuit board (PCB) assembly.

BACKGROUND

Figure 1:
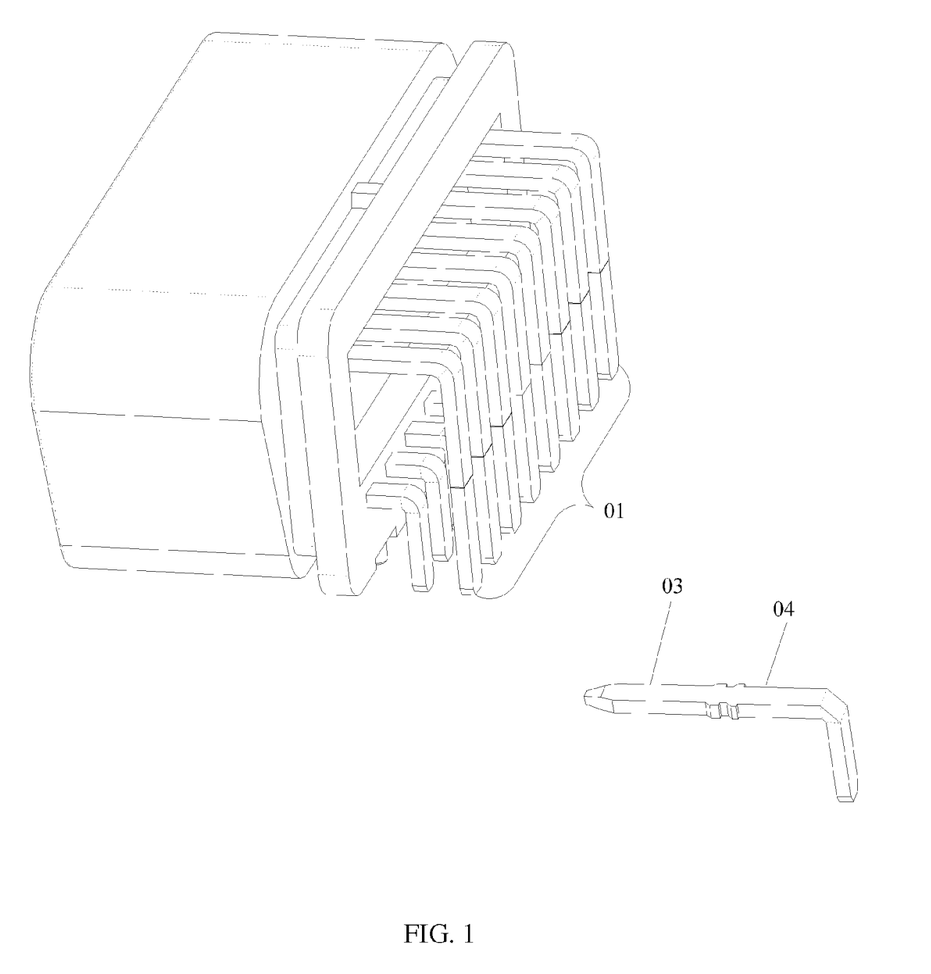
FIG. 1 is a schematic diagram of composition of an OBD II plug according to the prior art.
Figure 2:
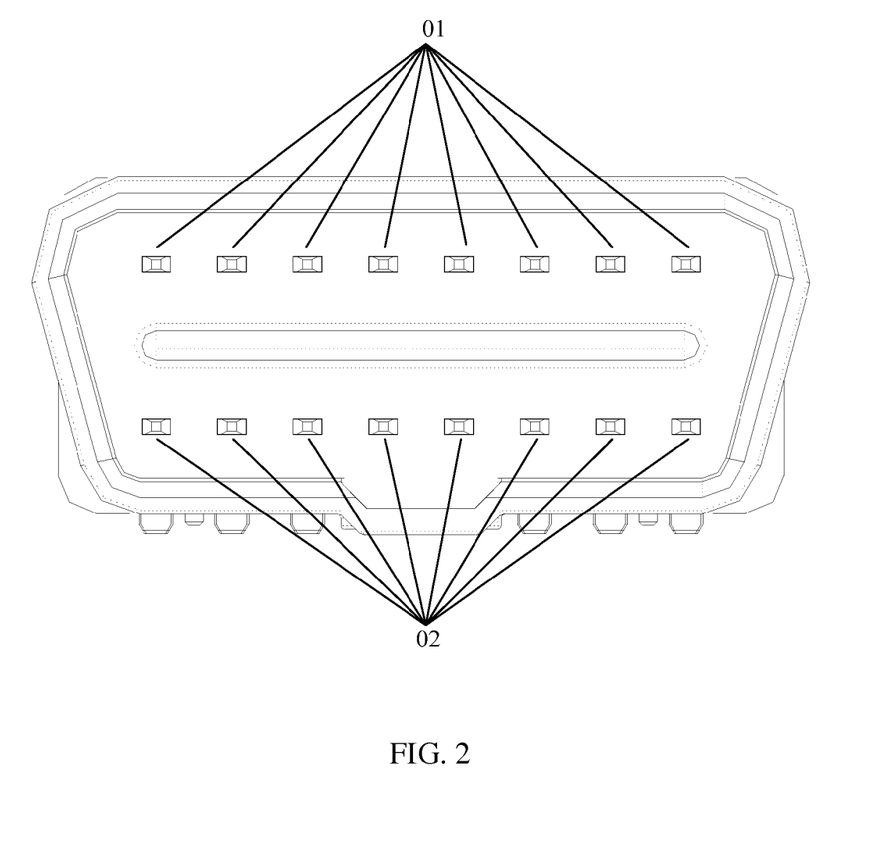
FIG. 2 is a main view of an OBD II plug according to the prior art.

An on-board diagnostics II (OBD II) plug is a connector that uses a dedicated data line interface between an automobile and an on-board diagnostics system and is a standard device in the automobile industry, and has very wide application in the automobile testing industry. In a current market, a type of OBD II plug is provided, where FIG. 1 is a schematic diagram of composition of an OBD II plug according to the prior art, and FIG. 2 is a main view of the OBD II plug according to the prior art. As shown in FIG. 2, 16 male pins of the OBD II plug are divided into a first row 01 and a second row 02 and arranged according to manners shown in FIG. 1 and FIG. 2. As shown in FIG. 1, a first end 03 of each male pin of the 16 male pins is clamped to a slot, a second end 04 of each male pin is bent, and it can be seen from FIG. 1 that, much space is wasted because a male pin located in the first row 01 is bent, thereby affecting an overall size of a PCB assembly.

SUMMARY

Embodiments of the present invention provide a plug and a PCB assembly, which reduces a volume of the PCB assembly.

To achieve the foregoing objective, the following technical solutions are used in the embodiments of the present invention.

According to a first aspect of the present invention, a plug is provided, and includes a plug body, where a first row of slots and a second row of slots are disposed on the plug body, and the first row and the second row are parallel; and the plug further includes first pins in one-to-one correspondence with the first row of slots and second pins in one-to-one correspondence with the second row of slots; where the first pin is L-shaped, one end of the first pin is embedded in a slot, in a corresponding position, of the first row of slots, and the other end is configured to connect to a first PCB; and the second pin is stair-shaped, one end of the second pin is embedded in a slot, in a corresponding position, of the second row of slots, and the other end is configured to connect to the first PCB, is parallel to the end, which is connected to the first PCB, of the first pin, and is located on an outer side of the end, which is connected to the first PCB, of the first pin.

With reference to the first aspect, in a possible implementation manner, clamping slots in one-to-one correspondence with the second row of slots are further disposed on the plug body, and the clamping slot is configured to correct a position deviation of the second pin.

According to a second aspect of the present invention, a PCB assembly is provided, and includes a plug and a first PCB; where the plug includes a plug body, where a first row of slots and a second row of slots are disposed on the plug body, and the first row and the second row are parallel; and the plug further includes first pins in one-to-one correspondence with the first row of slots and second pins in one-to-one correspondence with the second row of slots; the first pin is L-shaped, one end of the first pin is embedded in a slot, in a corresponding position, of the first row of slots, and the other end is configured to connect to the first PCB; and the second pin is stair-shaped, one end of the second pin is embedded in a slot, in a corresponding position, of the second row of slots, and the other end is configured to connect to the first PCB, is parallel to the end, which is connected to the first PCB, of the first pin, and is located on an outer side of the end, which is connected to the first PCB, of the first pin; and the first PCB is configured to connect to one end of the first pin of the plug and connect to one end of the second pin of the plug.

With reference to the second aspect, in a possible implementation manner, the PCB assembly further includes a second PCB, where the second PCB is connected to the first PCB by using a connector, and the second pin of the plug is located between the first PCB and the second PCB.

With reference to the second aspect and the foregoing possible implementation manner, in another possible implementation manner, one end of the second PCB is closely adjacent to the plug body of the plug.

According to the plug and the PCB assembly that are provided in the embodiments of the present invention, the plug includes a plug body, where a first row of slots and a second row of slots are disposed on the plug body, and the first row and the second row are parallel; and the plug further includes first pins in one-to-one correspondence with the first row of slots and second pins in one-to-one correspondence with the second row of slots, the first pin is L-shaped, and the second pin is stair-shaped. The second pin is stair-shaped, and therefore a second PCB may be disposed above the second pin, so that components of the second PCB may be arranged by maximizing use of space, thereby reducing a volume of the PCB assembly.

BRIEF DESCRIPTION OF THE DRAWINGS

To describe the technical solutions in the embodiments of the present invention or in the prior art more clearly, the following briefly introduces the accompanying drawings required for describing the embodiments or the prior art. The accompanying drawings in the following description show merely some embodiments of the present invention, and a person of ordinary skill in the art may still derive other drawings from these accompanying drawings without creative efforts.

DETAILED DESCRIPTION

The following clearly describes the technical solutions in the embodiments of the present invention with reference to the accompanying drawings in the embodiments of the present invention. The described embodiments are merely a part rather than all of the embodiments of the present invention. All other embodiments obtained by a person of ordinary skill in the art based on the embodiments of the present invention without creative efforts shall fall within the protection scope of the present invention.

Embodiment 1

Figure 3:
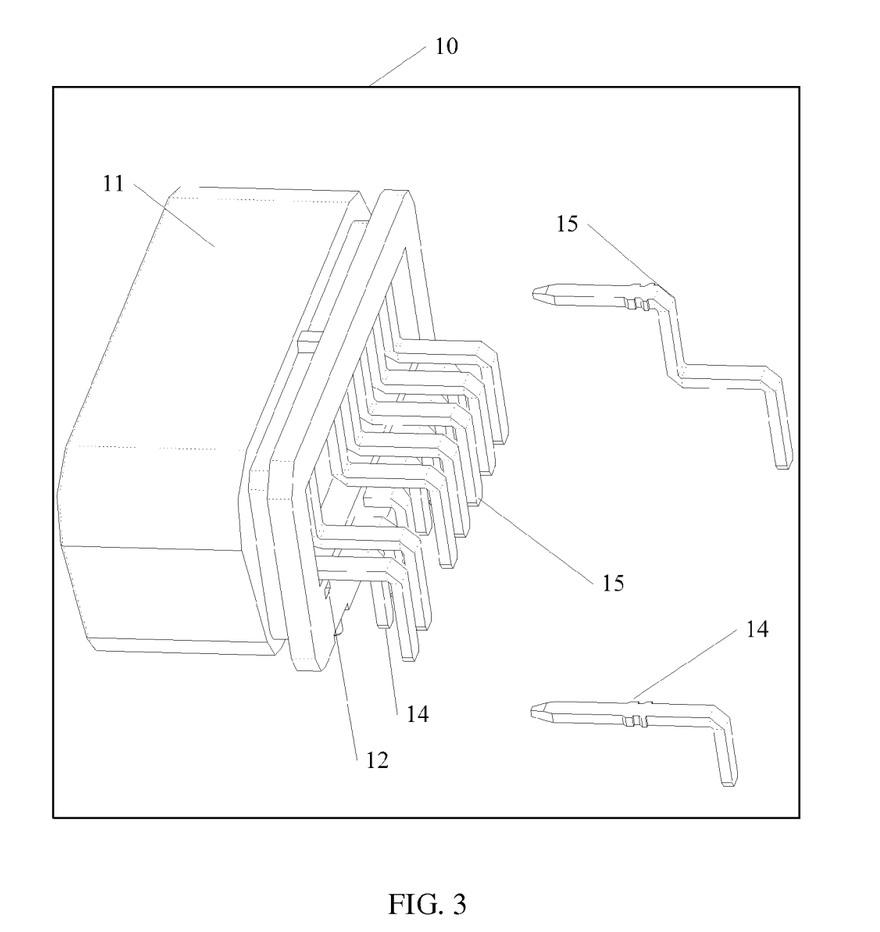
FIG. 3 is a schematic diagram of composition of a plug according to Embodiment 1 of the present invention.
Figure 4:
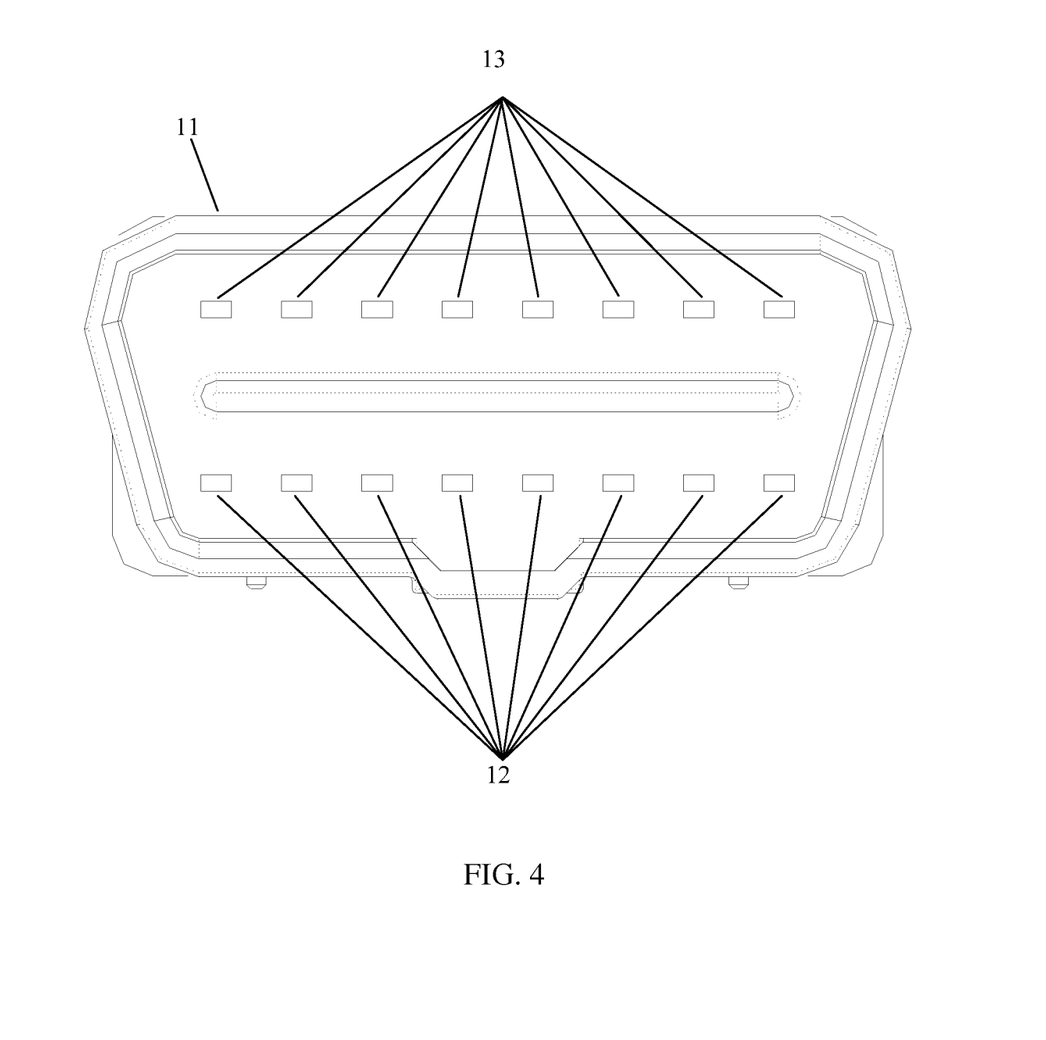
FIG. 4 is a main view of a plug body according to Embodiment 1 of the present invention.

Embodiment 1 of the present invention provides a plug 10. FIG. 3 is a schematic diagram of composition of the plug 10 according to the embodiment of the present invention, and the plug 10 shown in FIG. 3 may include a plug body 11. FIG. 4 is a main view of the plug body 11 according to the embodiment of the present invention, and a first row of slots 12 and a second row of slots 13 are disposed on the plug body 11 shown in FIG. 4, where the first row and the second row are parallel. The plug 10 shown in FIG. 3 further includes first pins 14 in one-to-one correspondence with the first row of slots 12 and second pins 15 in one-to-one correspondence with the second row of slots 13.

The first pin 14 is L-shaped, one end of the first pin 14 is embedded in a slot, in a corresponding position, of the first row of slots 12, and the other end is configured to connect to a first PCB.

The second pin 15 is stair-shaped, one end of the second pin 15 is embedded in a slot, in a corresponding position, of the second row of slots 13, and the other end is configured to connect to the first PCB, is parallel to the end, which is connected to the first PCB, of the first pin 14, and is located on an outer side of the end, which is connected to the first PCB, of the first pin 14.

A stair shape of the second pin 15 may be obtained by bending a pin for two or more times. Compared with a pin in the prior art, the second pin 15 obtained after being bent for two or more times may save a large amount of space. In this way, the large amount of space saved by the second pin 15 may be used to dispose a second PCB of a PCB assembly, so that a volume of the PCB assembly is reduced.

Figure 5:
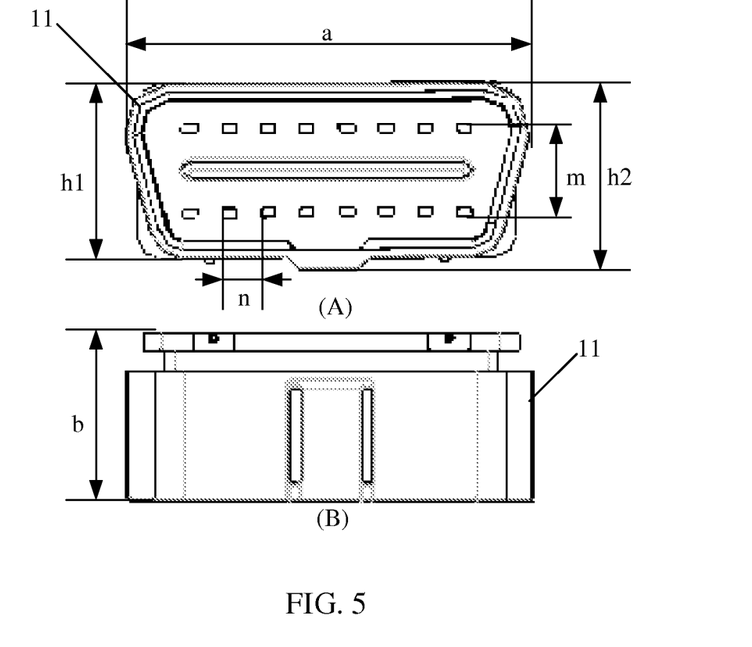
FIG. 5 is a schematic diagram of a size of a plug body according to Embodiment 1 of the present invention.

Exemplarily, in the embodiment of the present invention, according to what is stipulated in an OBD II protocol and referring to FIG. 5, a size of the plug body 11 may specifically be that referring to a main view of the plug body 11 shown in FIG. 5(A), it may be known that a length a of the plug body 11 meets that a=41.34 millimeters; referring to a bottom view of the plug body 11 shown in FIG. 5(B), it may be known that a width b of the plug body 11 meets that b=17.25 millimeters; and referring to the main view of the plug body 11 shown in FIG. 5(A), it may be known that heights h1 and h2 of the plug body 11 meet that h1=17.90 millimeters, and h2=19.00 millimeters.

Exemplarily, in the embodiment of the present invention, according to what is stipulated in the OBD II protocol, referring to FIG. 5, and referring to the main view of the plug body 11 shown in FIG. 5(A), it may be known that a distance m between the first row of slots 12 and the second row of slots 13 meets that m=8.60 millimeters. Referring to the main view of the plug body 11 shown in FIG. 5(A), it may be known that a distance n between every two adjacent slots of the first row of slots 12 and a distance n between every two adjacent slots of the second row of slots 13 both meet that n=4.00 millimeters.

Figure 6:
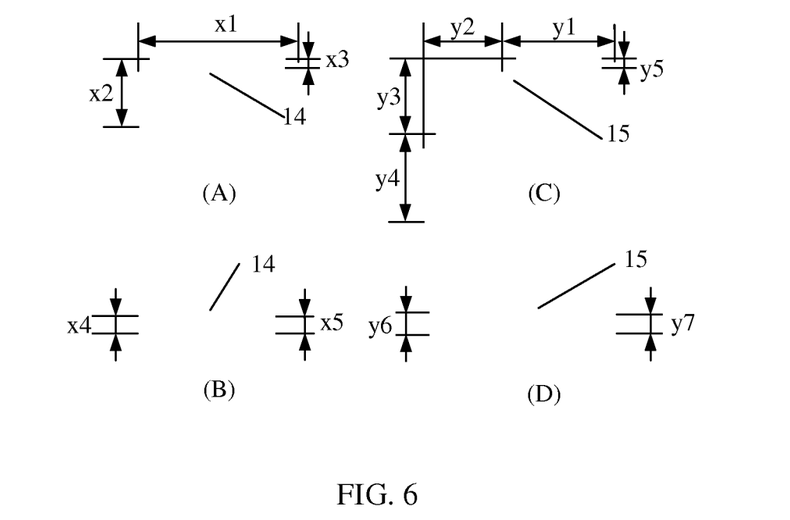
FIG. 6 is a schematic diagram of sizes of a first pin and a second pin according to Embodiment 1 of the present invention.

Exemplarily, in the embodiment of the present invention, according to what is stipulated in the OBD II protocol and referring to a main view of the first pin 14 shown in FIG. 6(A) and a top view of the first pin 14 shown in FIG. 6(B), it may be known that a size of the first pin 14 may be that x1=14.35 millimeters, x2=6.10 millimeters, x3=0.80 millimeters, x4=1.60 millimeters, and x5=1.50 millimeters.

Exemplarily, in the embodiment of the present invention, according to what is stipulated in the OBD II protocol and referring to a main view of the second pin 15 shown in FIG. 6(C) and a top view of the second pin 15 shown in FIG. 6(D), it may be known that a size of the second pin 15 may be that y1=10.10 millimeters, y2=7.05 millimeters, y3=6.80 millimeters, y4=7.90 millimeters, y5=0.80 millimeters, y6=1.80 millimeters, and y7=1.50 millimeters.

It should be noted that, in the embodiment of the present invention, the size of the plug body 11, the distance between the first row of slots 12 and the second row of slots 13, the distance between every two adjacent slots of the first row of slots 12, the distance between every two adjacent slots of the second row of slots 13, the size of the first pin 14, and the size of the second pin 15 are merely used as examples for description, and no specific limitation is imposed on the size of the plug body 11, the distance between the first row of slots 12 and the second row of slots 13, the distance between every two adjacent slots of the first row of slots 12, the distance between every two adjacent slots of the second row of slots 13, the size of the first pin 14, and the size of the second pin 15 in the embodiment of the present invention.

It should be noted that, in the embodiment of the present invention, the number of slots of the first row of slots 12 is the same as the number of first pins 14, the number of slots of the second row of slots 13 is the same as the number of second pins 15, and in the embodiment of the present invention, no limitation is imposed on the number of slots of the first row of slots 12 and the number of first pins 14 herein, and no limitation is imposed on the number of slots of the second row of slots 13 and the number of second pins 15 either herein.

For ease of understanding by a person skilled in the art, in the embodiment of the present invention, exemplarily, the first row of slots 12 disposed on the plug body 11 shown in FIG. 4 includes 8 slots, the second row of slots 13 also includes 8 slots, and the plug 10 shown in FIG. 3 includes 8 first pins 14 and 8 second pins 15.

Figure 7:
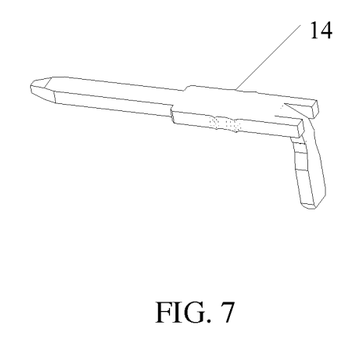
FIG. 7 is a schematic diagram of a first pin according to Embodiment 1 of the present invention.
Figure 8:
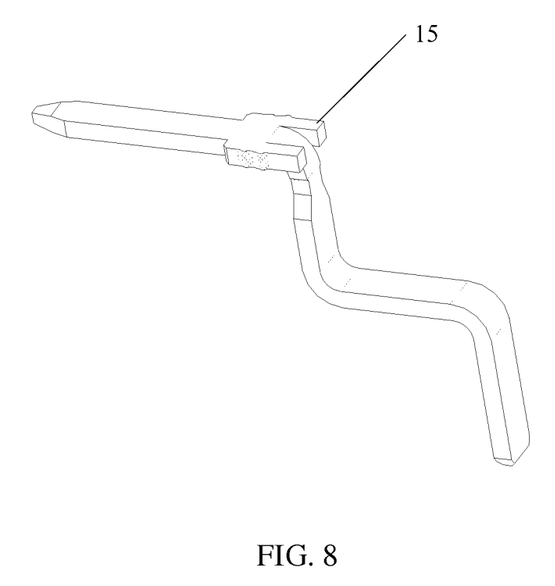
FIG. 8 is a schematic diagram of a second pin according to Embodiment 1 of the present invention.
Figure 9:
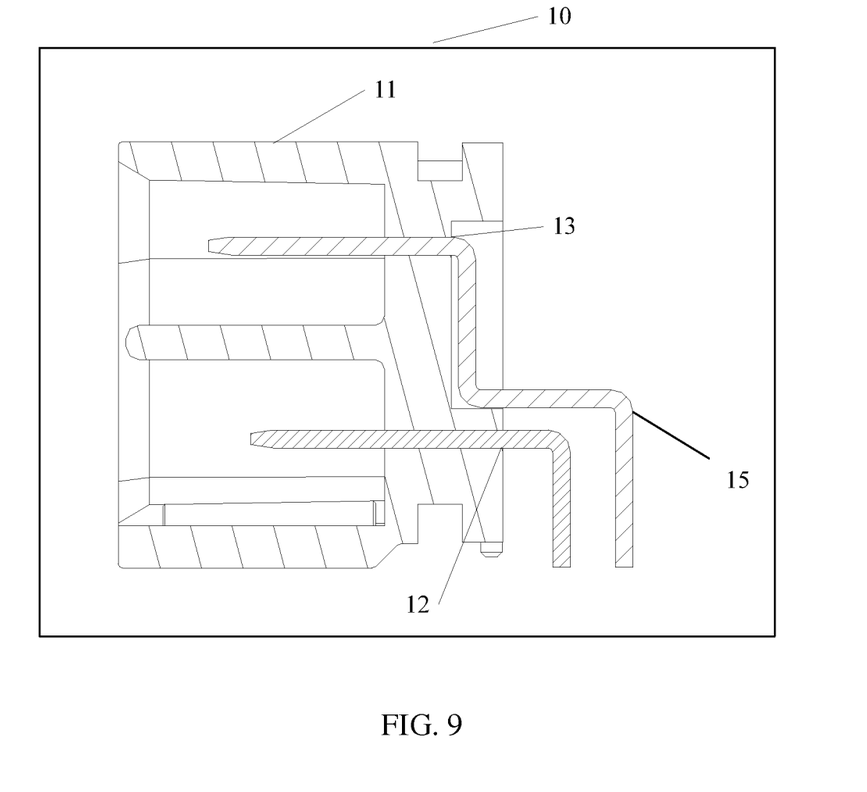
FIG. 9 is a cross-sectional view of a plug according to Embodiment 1 of the present invention.

FIG. 7 is a schematic diagram of a first pin 14 according to an embodiment of the present invention. The first pin 14 shown in FIG. 7 is L-shaped. FIG. 8 is a schematic diagram of a second pin 15 according to an embodiment of the present invention. The second pin 15 shown in FIG. 8 is a stair-shaped pin obtained after being bent twice. FIG. 9 is a cross-sectional view of a plug 10 according to an embodiment of the present invention. As shown in FIG. 9, one end of each first pin 14 of the 8 first pins 14 is embedded in a slot, in a corresponding position, of 8 slots included in the first row of slots 12, and the other end is configured to connect to the first PCB. In a possible implementation manner, one end of the first pin 14 may be connected to the first PCB by welding. As shown in FIG. 9, one end of each second pin 15 of the 8 second pins 15 is embedded in a slot, in a corresponding position, of 8 slots included in the second row of slots 13, and the other end is configured to connect to the first PCB, is parallel to the end, which is connected to the first PCB, of the first pin 14, and is located on an outer side of the end, which is connected to the first PCB, of the first pin 14. In a possible implementation manner, one end of the second pin 15 may be connected to the first PCB by welding.

Figure 10:
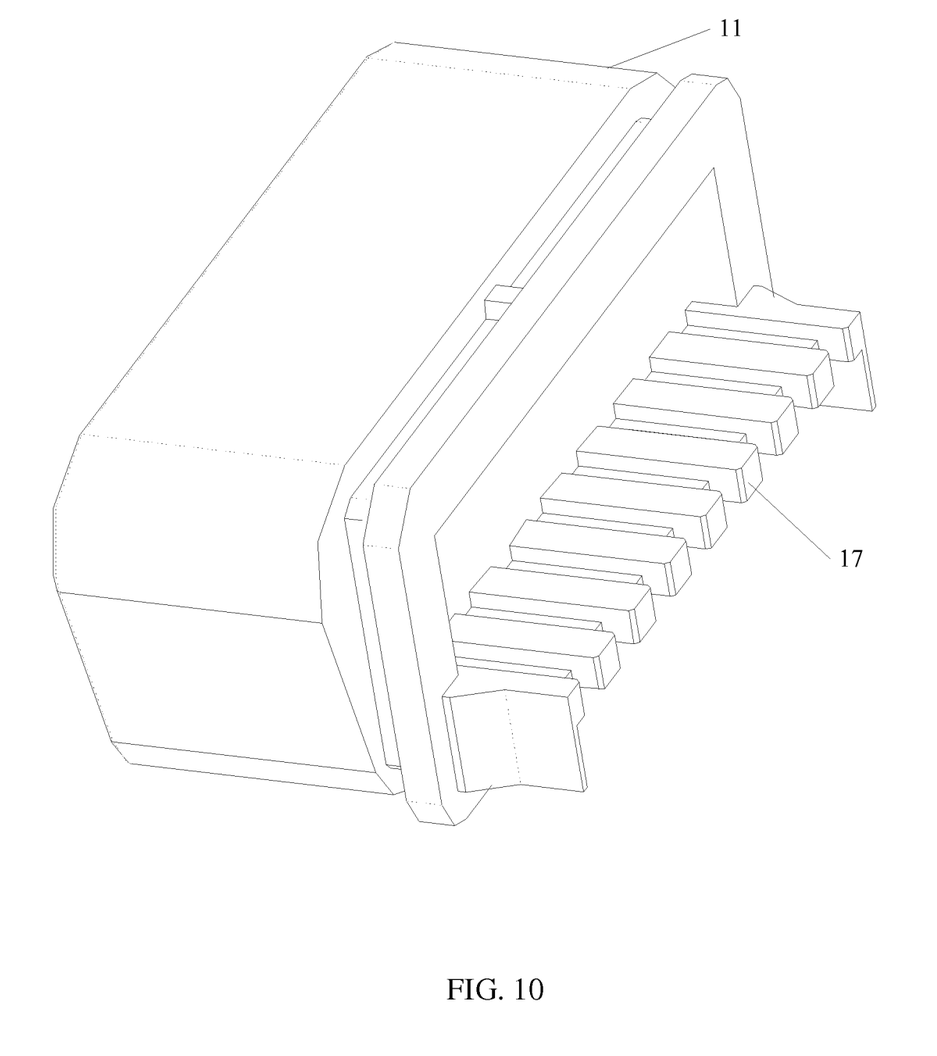
FIG. 10 is a schematic diagram of composition of a plug body according to Embodiment 1 of the present invention.

In another embodiment of the present invention, FIG. 10 is a schematic diagram of composition of a plug body 11 according to an embodiment of the present invention. Clamping slots 17 in one-to-one correspondence with the second row of slots 13 are further disposed on the plug body 11 shown in FIG. 10, and the clamping slot 17 is configured to correct a position deviation of the second pin 15.

Exemplarily, a connection manner of the clamping slot 17 and the plug body 11 may be a fixed connection, for example, the clamping slot 17 is connected to the plug body 11 by welding, the clamping slot 17 and the plug body 11 may also be integrally formed, and in the embodiment of the present invention, no specific limitation is imposed on the connection manner of the clamping slot 17 and the plug body 11 herein. A connection manner of the clamping slot 17 and the second pin 15 may be clamping, and may also be another connection manner, and in the embodiment of the present invention, no specific limitation is imposed on the connection manner of the clamping slot 17 and the second pin 15 either herein.

Exemplarily, in the embodiment of the present invention, a distance between every two clamping slots 17 of the clamping slots 17 in one-to-one correspondence with the second row of slots 13 may be 4.00 millimeters.

Figure 11:
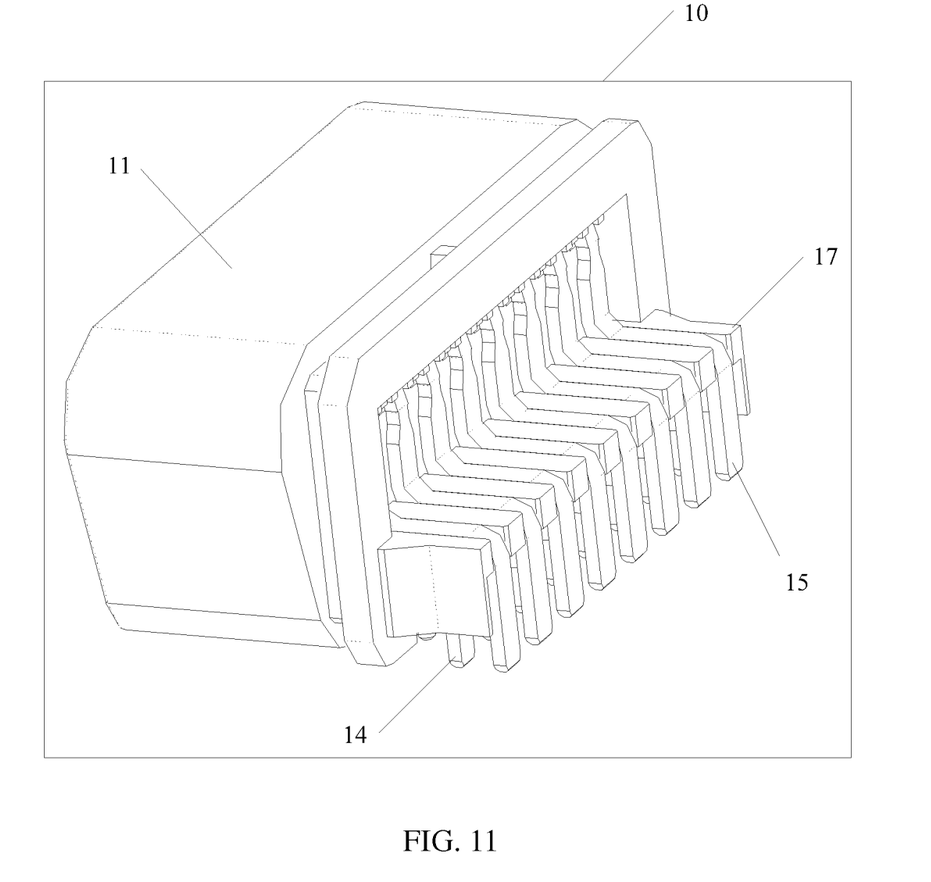
FIG. 11 is a schematic diagram of composition of another plug according to Embodiment 1 of the present invention.

Exemplarily, FIG. 11 is a diagram of an overall structure of a plug 10 including first pins 14, second pins 15, and clamping slots 17. The clamping slots 17 may correct position deviations of the second pins 15, so that angles of all the second pins 15 are kept consistent, thereby facilitating assembly.

According to the plug provided in the embodiment of the present invention, the plug includes a plug body, where a first row of slots and a second row of slots are disposed on the plug body, and the first row and the second row are parallel; the plug further includes first pins in one-to-one correspondence with the first row of slots and second pins in one-to-one correspondence with the second row of slots, the first pin is L-shaped, and the second pin is stair-shaped. The second pin is stair-shaped, and therefore a second PCB may be disposed above the second pin, so that components of the second PCB may be arranged by maximizing use of space, thereby reducing a volume of a PCB assembly.

In addition, clamping slots in one-to-one correspondence with the second row of slots are disposed on the plug body of the plug, so that a position deviation that may be caused after the second pin is bent is corrected.

Embodiment 2

Figure 12:
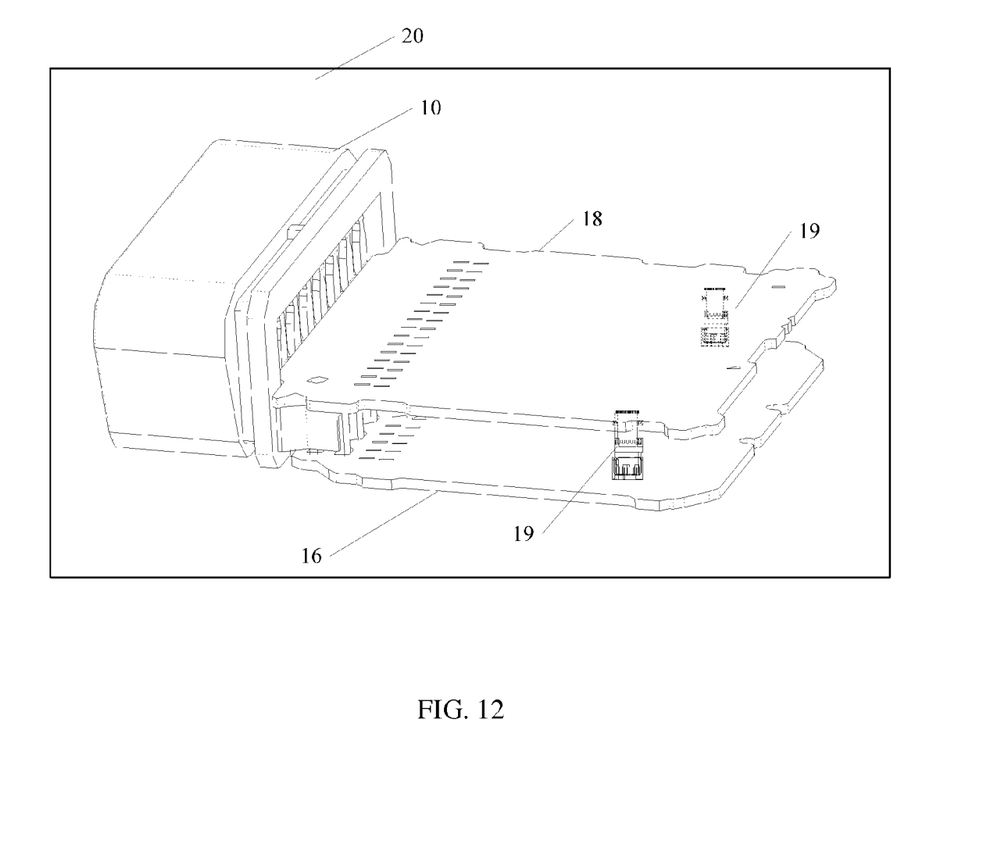
FIG. 12 is a schematic diagram of composition of a PCB assembly according to Embodiment 2 of the present invention.

Embodiment 2 of the present invention provides a PCB assembly 20. As shown in FIG. 12, the PCB assembly 20 may include a plug 10 shown in FIG. 3 and a first PCB 16.

The first PCB 16 is configured to connect to one end of a first pin 14 of the plug 10 and connect to one end of a second pin 15 of the plug 10. In a possible implementation manner, on end of the first pin 14 may be connected to the first PCB 16 by welding, and one end of the second pin 15 may be connected to the first PCB 16 by welding.

It should be noted that, for a specific description of the plug 10 in the embodiment of the present invention, reference may be made to a specific description of the plug 10 in Embodiment 1 of the present invention, and details are not described herein again in the embodiment of the present invention.

In the embodiment of the present invention, optionally, as shown in FIG. 12, the PCB assembly 20 may further include a second PCB 18.

The second PCB 18 is connected to the first PCB 16 by using a connector 19, and the second pin 15 of the plug 10 is located between the first PCB 16 and the second PCB 18.

It should be noted that FIG. 12 merely shows an exemplary structure of the connector 19, and no limitation is imposed on specific composition of the connector 19 herein in the embodiment of the present invention.

In the embodiment of the present invention, further, optionally, as shown in FIG. 12, one end of the second PCB 18 is closely adjacent to the plug body 11 of the plug 10. Because the second pin 15 is stair-shaped, the second PCB 18 may be disposed at a position shown in FIG. 12, so that components of the second PCB 18 may be arranged by maximizing use of space, thereby reducing a volume of the PCB assembly 20.

The PCB assembly provided in the embodiment of the present invention includes a plug, where the plug includes a plug body, a first row of slots and a second row of slots are disposed on the plug body, and the first row and the second row are parallel; the plug further includes first pins in one-to-one correspondence with the first row of slots and second pins in one-to-one correspondence with the second row of slots, the first pin is L-shaped, and the second pin is stair-shaped. The second pin is stair-shaped, and therefore a second PCB may be disposed above the second pin, so that components of the second PCB may be arranged by maximizing use of space, thereby reducing a volume of the PCB assembly.

In addition, clamping slots in one-to-one correspondence with the second row of slots are disposed on the plug body of the plug, so that a position deviation that may be caused after the second pin is bent is corrected.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present invention essentially, or the part contributing to the prior art, or a part of the technical solutions may be implemented in a form of a software product. The software product is stored in a storage medium, and includes several instructions for instructing a computer device (which may be a personal computer, a server, or a network device) to perform all or a part of the steps of the methods described in the embodiments of the present invention. The foregoing storage medium includes any medium that can store program code, such as a universal serial bus (USB) flash drive, a removable hard disk, a read-only memory (ROM), a random-access memory (RAM), a magnetic disk, or an optical disc.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A plug, comprising:
   a plug body, wherein a first row of slots and a second row of slots are disposed on the plug body, and the first row and the second row are parallel;
   first pins in one-to-one correspondence with the first row of slots;
   second pins in one-to-one correspondence with the second row of slots, wherein each of the first pins is L-shaped, one end of the first pin is embedded in a slot, in a corresponding position, of the first row of slots, and the other end is configured to connect to a first printed circuit board (PCB), and wherein each of the second pins is stair-shaped, one end of the second pin is embedded in a slot, in a corresponding position, of the second row of slots, and the other end is stair-shaped and is configured to connect to the first PCB, is parallel to the end, which is connected to the first PCB, of the first pin, and is located on an outer side of the end, which is connected to the first PCB, of the first pin; and
   a second PCB disposed on the other end of the second stair-shaped pins and clamping slots, wherein the second PCB is connected to the first PCB by using connectors such that components of the second PCB are arranged by maximizing use of space,
   wherein the clamping slots are in one-to-one correspondence with the second row of slots and are further disposed on a rear of the plug body,
   wherein the clamping slots are configured to correct a position deviation of the second pin, and
   wherein the clamping slots are positioned between the first PCB and the second PCB.

2. The plug according to claim 1, wherein the plug comprises an on-board diagnostics II (OBD II) plug, wherein the first pins comprise eight pins, and wherein the second pins comprise eight pins.

3. The plug according to claim 1, wherein the first pins comprise one bend, wherein the second pins comprise two bends, and wherein the first row of slots and the second row of slots are different rows and are parallel.

4. The plug according to claim 1, wherein the first pins and the second pins comprise a same number of pins, wherein all of the first pins have a same L-shape, and wherein all of the second pins have a same stair-shape.

5. A printed circuit board (PCB) assembly, comprising:
   a plug;
   a first PCB, wherein the first PCB is configured to connect to one end of a first pin of the plug and connect to one end of a second pin of the plug, wherein the plug comprises a plug body, first pins, and second pins, wherein a first row of slots and a second row of slots are disposed on a rear of the plug body, and the first row and the second row are parallel, wherein the first pins are in one-to-one correspondence with the first row of slots and the second pins are in one-to-one correspondence with the second row of slots, wherein each of the first pins is L-shaped, one end of the first pin is embedded in a slot, in a corresponding position, of the first row of slots, and the other end is stair-shaped and is configured to connect to a first PCB, and wherein each of the second pins is stair-shaped, one end of the second pin is embedded in a slot, in a corresponding position, of the second row of slots, and the other end is configured to connect to the first PCB, is parallel to the end, which is connected to the first PCB, of the first pin, and is located on an outer side of the end, which is connected to the first PCB, of the first pin; and
   a second PCB, wherein the second PCB is connected to the first PCB by using connectors, and wherein the second PCB is disposed on the other end of the second stair-shaped pin and clamping slots such that components of the second PCB are arranged by maximizing use of space,
   wherein the clamping slots are in one-to-one correspondence with the second row of slots and are further disposed on a rear of the plug body,
   wherein the clamping slots are configured to correct a position deviation of the second pin, and
   wherein the clamping slots are positioned between the first PCB and the second PCB.

6. The PCB assembly according to claim 5, wherein one end of the second PCB is adjacent to a plug body of the plug.

7. The PCB assembly according to claim 5, wherein the plug comprises an on-board diagnostics II (OBD II) plug, wherein the first pins comprise eight pins, and wherein the second pins comprise eight pins.

8. The PCB assembly according to claim 5, wherein the first pins comprise one bend, wherein the second pins comprise two bends, and wherein the first row of slots and the second row of slots are different rows and are parallel.

9. The PCB assembly according to claim 5, wherein the first pins and the second pins comprise a same number of pins, wherein all of the first pins have a same L-shape, and wherein all of the second pins have a same stair-shape.

* * * * *